(12) United States Patent
Relleen et al.

(10) Patent No.: US 7,785,060 B2
(45) Date of Patent: Aug. 31, 2010

(54) MULTI-DIRECTIONAL MECHANICAL SCANNING IN AN ION IMPLANTER

(75) Inventors: Keith Relleen, Horsham (GB); Tristan Holtam, Horsham (GB)

(73) Assignee: Applied Materials, Inc., Santa Clara, CA (US)

( * ) Notice: Subject to any disclaimer, the term of this patent is extended or adjusted under 35 U.S.C. 154(b) by 819 days.

(21) Appl. No.: 11/588,432

(22) Filed: Oct. 27, 2006

(65) Prior Publication Data

US 2008/0142726 A1 Jun. 19, 2008

(51) Int. Cl.
*B66C 23/00* (2006.01)

(52) U.S. Cl. .............................. 414/744.5; 250/492.21

(58) Field of Classification Search ............... 250/492.2, 250/492.22, 492.21; 414/744.5
See application file for complete search history.

(56) References Cited

U.S. PATENT DOCUMENTS

| | | | |
|---|---|---|---|
| 4,736,107 A | 4/1988 | Myron | |
| 4,943,728 A | 7/1990 | Dykstra | |
| 5,003,183 A | 3/1991 | Nogami et al. | |
| 5,229,615 A | 7/1993 | Brune et al. | |
| 5,389,793 A | 2/1995 | Aitken et al. | |
| 5,406,088 A | 4/1995 | Brune et al. | |
| 5,898,179 A | 4/1999 | Smick et al. | |
| 6,953,942 B1 | 10/2005 | Graf et al. | |
| 7,105,838 B2 | 9/2006 | Nayler-Smith et al. | |
| 2002/0114690 A1* | 8/2002 | Ishigame | 414/744.5 |
| 2003/0012632 A1* | 1/2003 | Saeki et al. | 414/744.5 |
| 2003/0111617 A1 | 6/2003 | Pharand et al. | |
| 2005/0173655 A1 | 8/2005 | Naylor-Smith et al. | |
| 2005/0285052 A1* | 12/2005 | Wang et al. | 250/492.21 |

FOREIGN PATENT DOCUMENTS

| | | |
|---|---|---|
| JP | 2001038656 | 2/2001 |
| JP | 2006324205 | 11/2006 |

OTHER PUBLICATIONS

English Abstract of JP2006324205.
English Abstract of JP2001038656.

* cited by examiner

*Primary Examiner*—Bernard E Souw
*Assistant Examiner*—Johnnie L Smith
(74) *Attorney, Agent, or Firm*—Boult Wade Tennant

(57) ABSTRACT

A scanning arm assembly for multi-directional mechanical scanning of a semiconductor wafer or other substrate to be implanted includes a pair of drive arms connected by two linkage arms to form a quadrilateral. Rotary joints are provided to join adjacent arms together, and a substrate holder is provided on one linkage arm where it joins the other linkage arm. Thus, rotating the drive arms causes the substrate holder to move. Suitable control of the drive arms allows the substrate holder to be moved through an ion beam to follow many different paths and hence implant patterns.

43 Claims, 9 Drawing Sheets

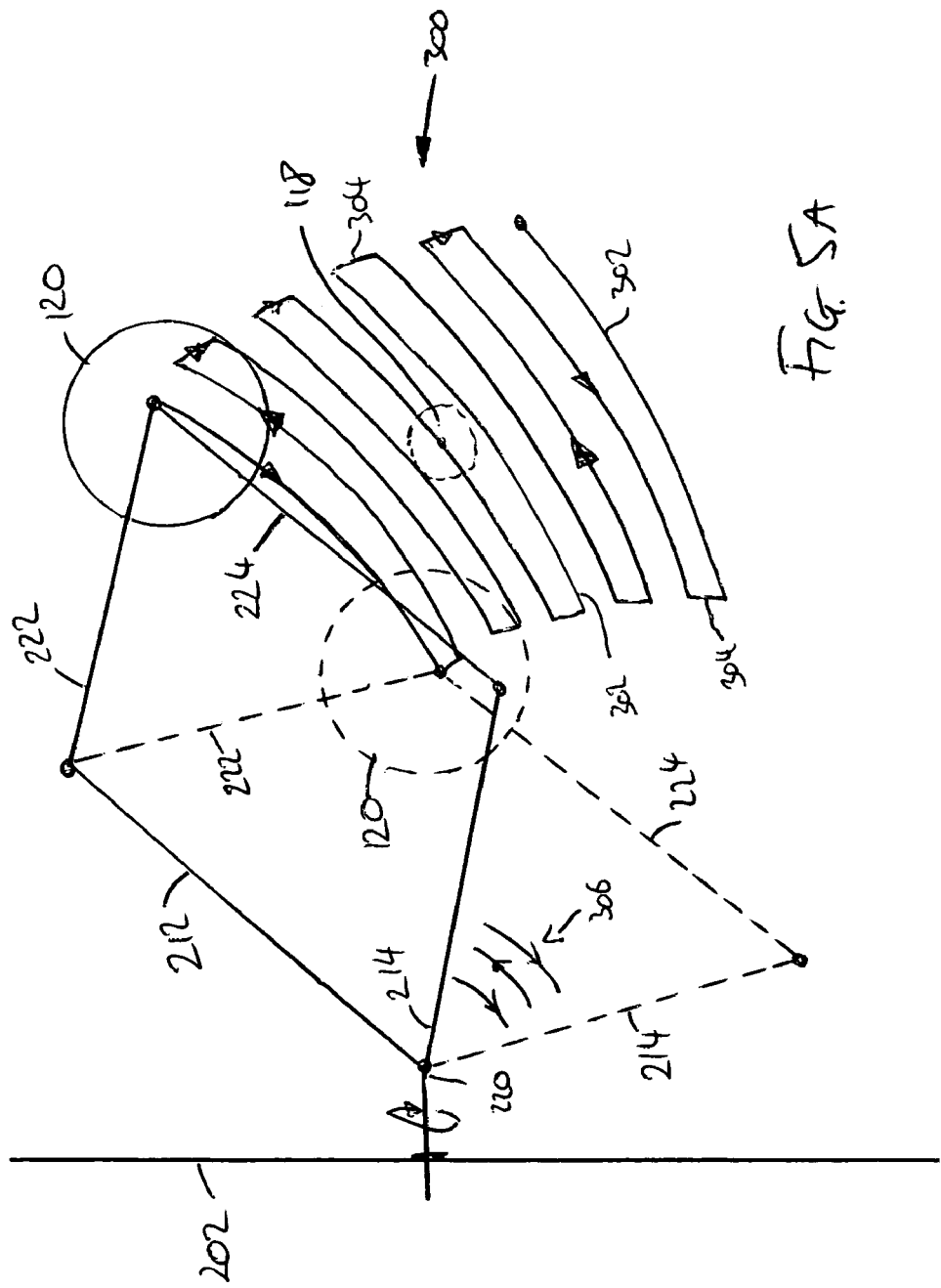

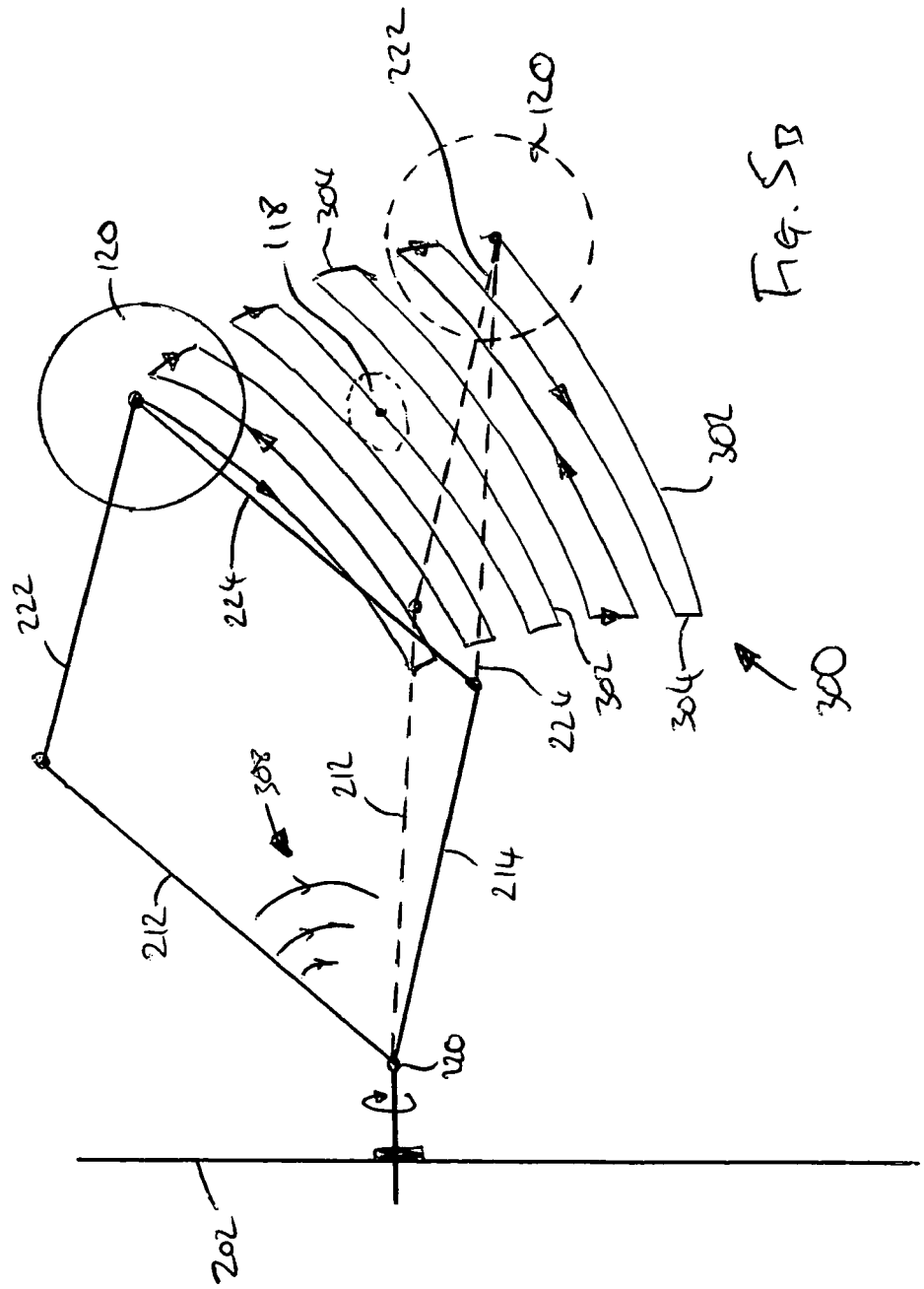

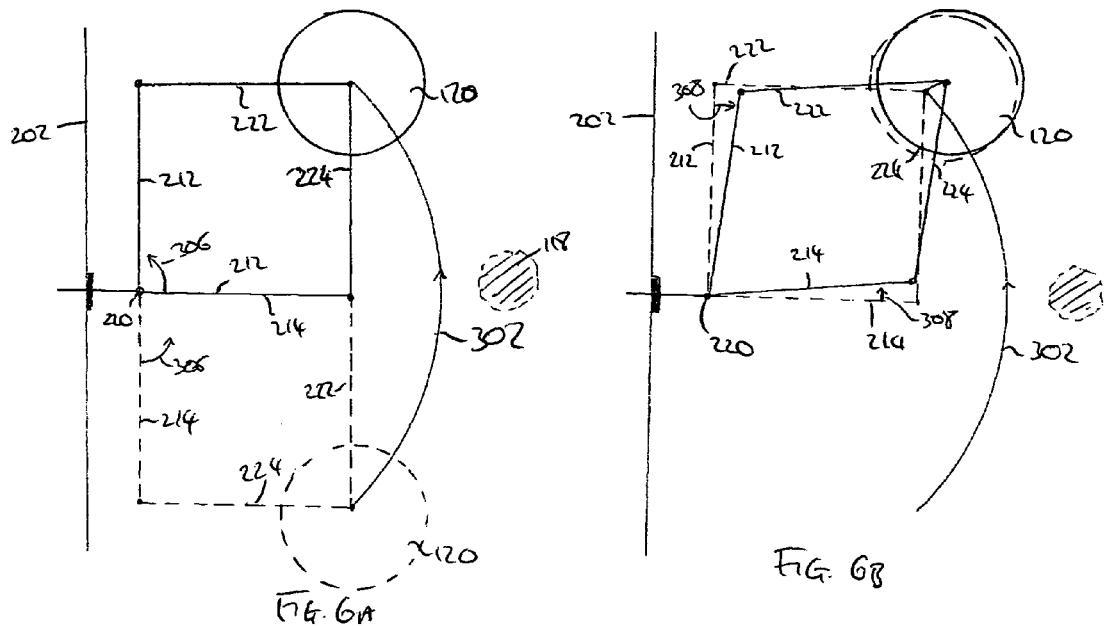
FIG. 6A
FIG. 6B
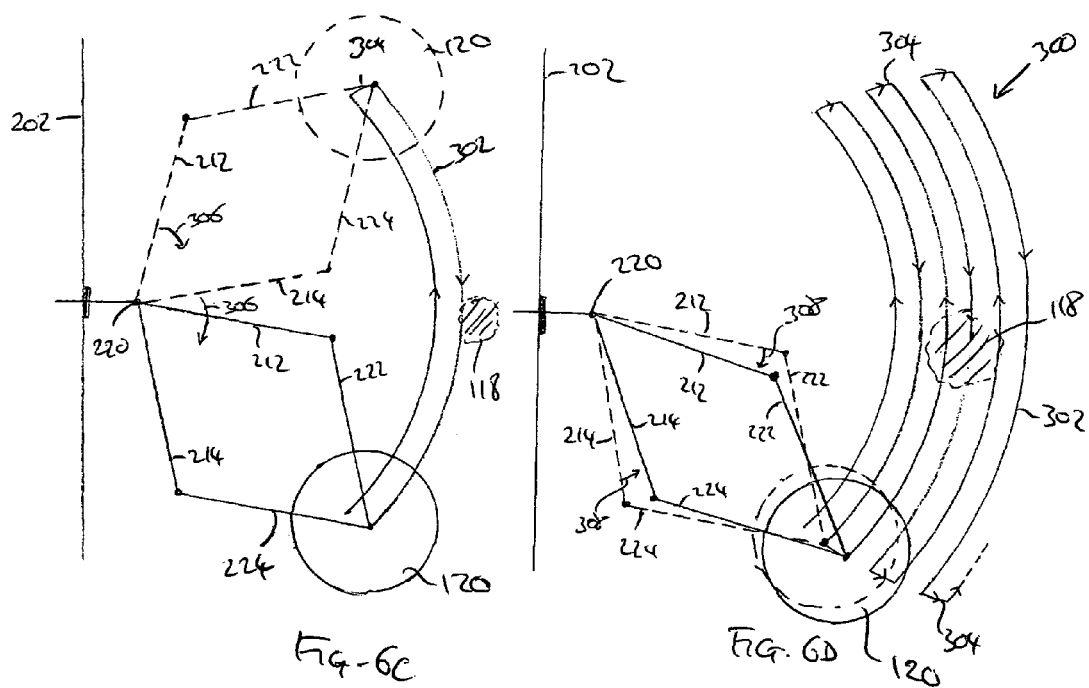
FIG. 6C
FIG. 6D

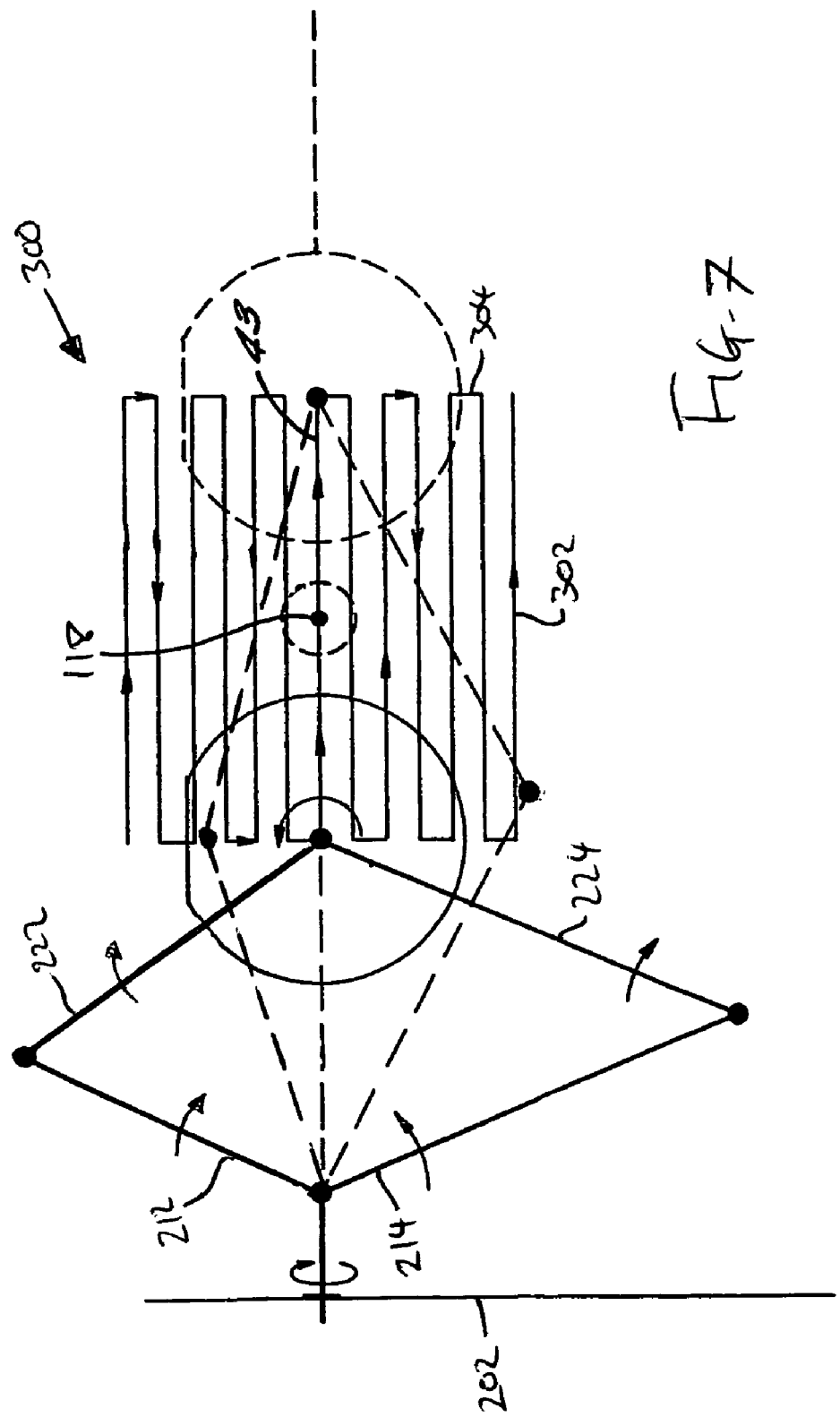

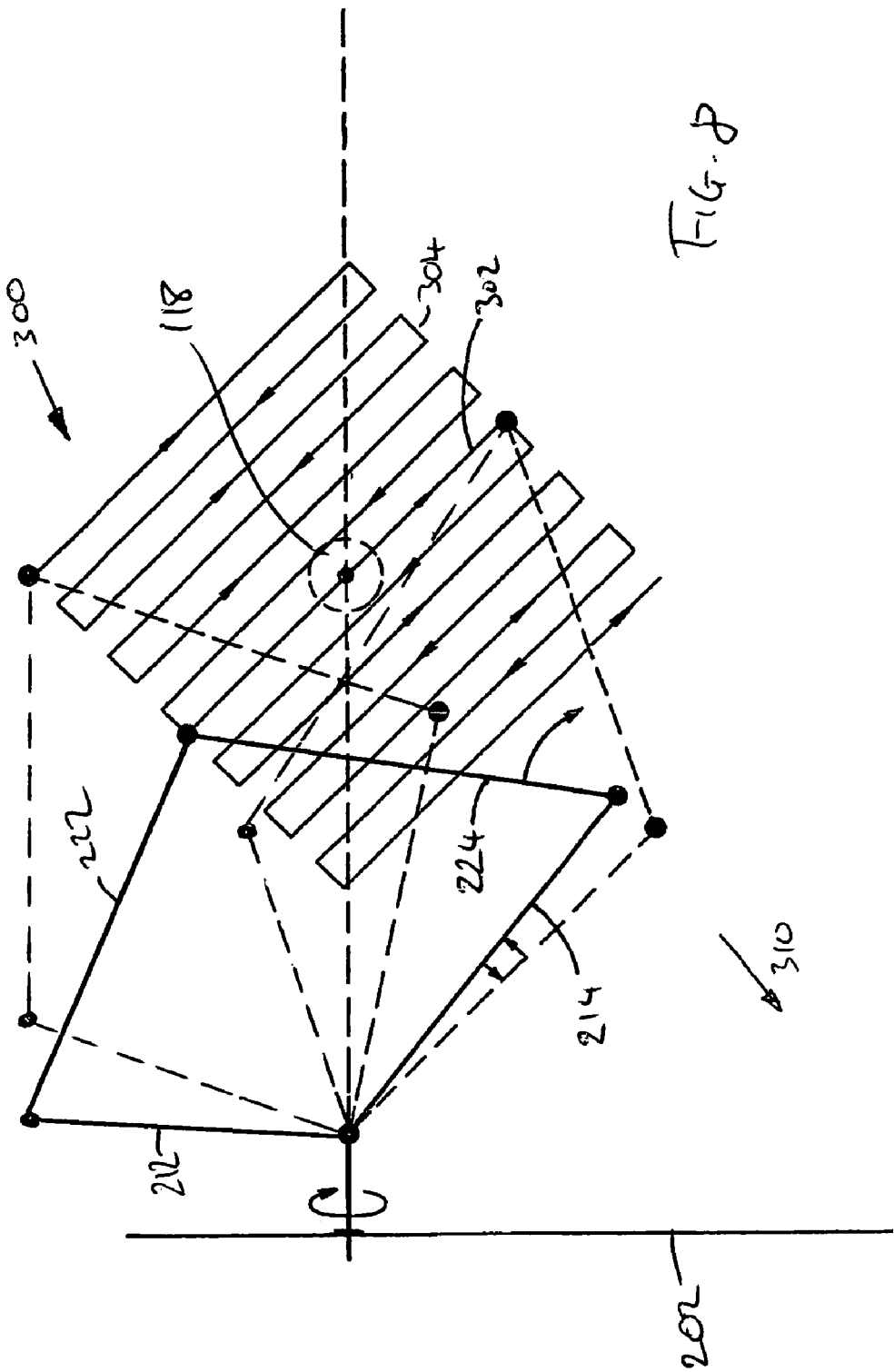

on rotary joints that are disposed side by side. The first and second drive arms may then rotate next to each other. Advantageously, the support is adapted to be mounted to a chamber wall of the ion implanter. The first and second drive arms may

MULTI-DIRECTIONAL MECHANICAL SCANNING IN AN ION IMPLANTER

FIELD OF THE INVENTION

This invention relates to a scanning arm assembly for multi-directional mechanical scanning of a semiconductor wafer or other substrate to be implanted. This invention also relates to an ion implanter incorporating such an assembly and to a method of implanting a substrate.

BACKGROUND OF THE INVENTION

In a typical ion implanter, a relatively small cross-section beam of dopant ions is scanned relative to a wafer or other substrate. This can be done in one of three ways: scanning of the beam in two directions relative to a stationary wafer, scanning of the wafer in two directions relative to a stationary beam, or a hybrid technique in which the beam is scanned in one direction while the wafer is mechanically scanned in a second direction. Typically, the two directions are orthogonal.

Batch implanters typically have a rotating wheel carrying a number of wafers around its periphery, and are designed for the simultaneous implantation of a batch of wafers in a process chamber of an implanter. The wheel is rotated so that each wafer passes through the ion beam in turn repeatedly as the axis of rotation is translated such that the ion beam traces across the entire wafer in a series of scan lines. An example of such a scanning wheel type batch implanter is disclosed in U.S. Pat. No. 5,389,793.

Some single-wafer implanters scan an ion beam in two directions relative to a stationary wafer, see for example U.S. Pat. No. 4,736,107. Other single-wafer implanters adopt hybrid techniques where the ion beam is scanned in one direction and the wafer mechanically scanned in an orthogonal direction, see for example U.S. Pat. No. 5,898,179, U.S. Pat. No. 5,003,183, U.S. Pat. No. 5,229,615 and U.S. Pat. No. 5,406,088.

Other single-wafer implanters scan the wafer in two directions relative to a fixed ion beam. Scanning arms that hold a wafer and effect linear translation of the wafer in two axes are well known. Typically, a cantilevered arm is mounted to extend horizontally from a wall of the process chamber. The arm is driven by linear actuators in both horizontal (x-axis) and vertical (y-axis) directions, the ion beam defining the z-axis. A raster scan is implemented relative to these directions as follows. The x-axis direction along the scanning arm is the fast-scan direction, i.e. the scanning arm is scanned to and fro to form successive scan lines on the wafer. The y-axis direction transverse to the scanning arm is the slow-scan direction, i.e. the scanning arm is moved in this direction after each scan line so as to cause the scan lines to be spaced uniformly.

An alternative scanning arm is described in WO2004/001789 and is shown herein in FIG. 1. A wafer 10 is scanned using rotational movements of an arm 1 provided with an elbow 30. The arm 1 is cantilevered from a shoulder 20, and both shoulder 20 and elbow 30 may be rotated about parallel axes 21 and 31 that extend in the same direction as the ion beam 50. Rotation is effected by a pair of motors, with one motor 22 being provided at the shoulder 20 and the other motor 32 being provided at the elbow 30.

The motors 22 and 32 are driven in opposite senses, as indicated by arrows 23 and 33, so as to move the wafer 10 horizontally through the ion beam 50 to form successive scan lines. In addition, motors 22 and 32 may be used to move the wafer 10 vertically between scan lines. A further motor 12 is provided at the distal end of scanning arm 1 so as to rotate the wafer 10 on its holder 14 about is central axis 11, i.e. about direction 13. This allows the orientation of the wafer 10 relative to the ion beam 50 to be kept constant as the shoulder 20 and elbow 30 are rotated to effect scanning of the wafer 10.

FIG. 1 shows the wafer 10 held perpendicularly to the ion beam 50. Implants may also be performed at other angles of incidence by virtue of a further motor 42 that rotates a boss 40 about axis 41. The shoulder 20 is mounted to the boss 40, such that rotation of the boss 40 in direction 43 causes the wafer 10 to tilt relative to the ion beam 50.

The scanning arm of FIG. 1 suffers from some disadvantages. Motor 32 has substantial mass that is located at the elbow 30 some distance away from the shoulder 20. This places a high torque requirement on motor 22 to move this cantilevered mass as it drives the scanning arm 1. In addition, the cantilevered mass of the motor 32 tends to produce vibrations in the scanning arm 1. These vibrations are transmitted to the wafer 10 leading to a lack of uniformity in the dose received across the wafer 10.

SUMMARY OF THE INVENTION

Against this background, and from a first aspect, the present invention resides in a substrate scanner for scanning a substrate through an ion beam in an ion implanter, the substrate holder comprising: a first drive arm provided on a rotary joint; a second drive arm provided on a rotary joint; drive means operable to rotate the first drive arm about a fixed first axis of rotation and to rotate the second drive arm about a fixed second axis of rotation; a linkage; and a substrate holder coupled to the linkage. The linkage is coupled to the first drive arm at a location removed from the first axis and coupled to the second drive arm at a location removed from the second axis such that the substrate holder moves as the first and/or second drive arm is rotated.

Providing two drive arms, both of which rotate about fixed axes, can be contrasted to the scanning arm assembly of WO2004/001789 where a first drive arm rotates about a fixed axis but where a second drive arm rotates about a varying axis. This second axis runs through the end of the first arm and so its position varies as the first arm is rotated. The arrangement of the present invention results in a simplified mathematical treatment when determining how to effect a desired motion of a substrate in that both axes of rotation remain fixed.

A further advantage of the present invention is that it is often advantageous to mount the drive means at the axis of rotation, thereby avoiding the need for gears, chains, belts, etc. In WO2004/001789 a motor is positioned at the second axis of rotation, and so the mass of the motor is cantilevered on the first drive arm. As a result, the scanning arm is more prone to vibration and a large torque must be applied to the first drive arm to cause rotation. In the present invention, drive means may be positioned at the fixed first and second axes such that their mass is not supported by either drive arm. Thus the inertia of the scanner is much reduced. Furthermore, the mass of the scanning arm can be reduced to minimise vibrations, and the mass of the drive means need not be moved.

Preferably, the first and second axes are parallel. Optionally, the first and second drive arms are coupled to a support such that the first and second axes are coaxial. For example, the first and second drive arms may be mounted to the support on rotary joints that are disposed side by side. The first and second drive arms may then rotate next to each other. Advantageously, the support is adapted to be mounted to a chamber wall of the ion implanter. The first and second drive arms may be coupled to the support adjacent the chamber wall. This is to the benefit of space and also minimizes the torque applied to the chamber wall.

Optionally, the first and second drive arms are coupled to the support at respective proximal ends. The first and second drive arms may be coupled to the linkage at respective distal ends.

The linkage may take one of several forms. For example, the linkage may use rotation or translation to effect movement of the substrate holder. As such, the linkage may by a bar arranged to slide as the first and second drive arms, for example through the provision of projecting parts received within guide slots. The guide slots may be provided on the linkage and the projecting parts on the drive arms, or vice versa. Alternatively, one or more rotary joints may be used to couple the linkage to the first and second drive arms.

The linkage may comprise more than one part. Where more than one part is used, movement may be effected exclusively using rotation. Preferably, the linkage comprises first and second members rotatably coupled together to rotate about a third axis, the first member also being rotatably coupled to the first drive arm to rotate about a fourth axis and the second member also being rotatably coupled to the second drive arm to rotate about a fifth axis. Advantageously, the first axis, second axis, third axis, fourth axis and fifth axis may be arranged to be parallel. Where the first and second axes are coaxial, the first and second drive arms and the first and second members of the linkage form a quadrilateral. As will be readily apparent, rotating the first and/or second drive arms causes rotation of the first and second members thereby moving the substrate holder.

Ends of the first and second members may be coupled to the first and second drive arms respectively and, optionally, further ends of the first and second members are coupled to each other. The first member may be provided with the substrate holder. The substrate holder may be provided at the at the end of the first member. This may be the end where it is coupled to the second member. Alternatively, the first member may extend beyond the point where it couples to the second member, and the substrate holder may then be provided at the end of the first member.

Optionally, the substrate holder is rotatably coupled to the linkage to allow rotation about a sixth axis. The sixth axis may extend parallel to the first, second, third, fourth and fifth axes. Preferably, the sixth axis extends substantially through the centre of the substrate holder. The substrate holder may comprise substrate holder drive means, optionally a motor, operable to rotate the substrate holder about the sixth axis.

The first and second drive means may take different forms. For example, they may be motors. These motors may act directly on the first and second drive arms. To this end, the motors may be positioned adjacent the first and second drive arms and may be directly coupled to their respective drive arm. Alternatively, the drive means may further comprise linkages to drive the drive arms, such as one or more gears, chains and belts.

Preferably, the support to which the drive arms are coupled is rotatable about a further axis. This further axis may be substantially normal to the first axis so as to extend in the general direction of the substrate holder. This allows the substrate to be tilted relative to the ion beam, as is desirable in some implants. This further axis may extend so as to pass directly in front of the substrate holder. This is advantageous as, if the axis is made to extend through the front face of a substrate when held on the substrate holder, the substrate then rotates about its centre line when tilting relative to the ion beam.

From a second aspect, the present invention resides in an ion implanter comprising an ion source operable to generate an ion beam, optics operable to guide the ion beam along an ion beam path, and any of the substrate scanners described above, wherein the first axis is parallel to the direction of the ion beam path at the substrate scanner.

From a third aspect, the present invention resides in a method of implanting a substrate using the above ion implanter, wherein the substrate holder is holding a substrate to be implanted, the method comprising: positioning the substrate adjacent the ion beam; and using the drive means to rotate the first drive arm thereby causing the substrate to travel through the ion beam, such that the ion beam traces a scan line across the substrate.

Where the first and second axes are parallel, the method may optionally comprise using the drive means to rotate the first and second drive arms in the same sense and at the same speed such that the ion beam traces a scan line across the substrate corresponding to an arc of a circle. Then, after tracing the arcuate scan line, the drive arms may be used to rotate the first and second drive arms to change the distance between the parallel first and second axes and the substrate holder. This may be done by using the drive means to rotate the first and second drive arms in opposite senses and, optionally, at the same speed. Preferably, this step is performed with the ion beam clear of the substrate. Preferably, the above steps are repeated such that series of scan lines are traced across the substrate corresponding to a series of arcs of concentric circles of differing radius. This is advantageous because adjacent arcs remain a uniform distance apart along their length. This allows uniform dosing while using a constant scanning speed. If, for example, arcs of a fixed radius were used, where the centre of the corresponding circle is varied, then the scan lines would not remain a fixed distance apart. This may be compensated by varying the scanning speed as the separation varies, but this requires a complex control law. A further improvement can be made by using the drive means to rotate the first and second drive arms repeatedly such that the distance between the parallel first and second axes and the substrate holder is changed uniformly such that the arcuate scan lines are evenly separated. This allows the first and second drive arms to be rotated at a common speed across each scan line to obtain uniform dosing of the substrate.

Optionally, the method comprises using the drive means to rotate the first and second drive arms simultaneously such that the ion beam traces a straight scan line across the substrate. In addition, the method may comprise using the drive means to rotate the first and second drive arms simultaneously in opposite senses while the ion beam traces a straight scan line across the substrate. Optionally, the method further comprises using the drive means to rotate the second drive arm thereby to move the substrate to be ready for the implantation along the next scan line. Preferably, this is done with the substrate clear of the ion beam. For example, the method may comprise using the drive means repetitively to rotate the first and second drive arms such that the ion beam traces a series of scan lines, such as a raster pattern, across the substrate. Optionally, the method may further comprise rotating the substrate while using the drive means to move the substrate through the ion beam so as to maintain the orientation of the substrate relative to the ion beam.

The above methods allow rapid scanning of the substrate to be effected simply by coordinated driving of the drive arms.

From a fourth aspect, the present invention resides in a method of scanning a substrate through an ion beam in ion implanter using a scanning arm, the method comprising: rotating a first part of the scanning arm about a fixed first axis of rotation; and rotating a second part of the scanning arm about a fixed second axis of rotation, wherein the scanning arm comprises a third part linking the first and second parts, the third part having a substrate holder coupled thereto. Optionally, the first and second axes are parallel and may be coaxial.

The present invention also extends to a computer programmed to effect the above described methods, an ion implanter comprising such a computer and to a computer program that when loaded into a computer of an ion implanter, causes the ion implanter to operate in accordance with the above described methods.

BRIEF DESCRIPTION OF THE DRAWINGS

An example of the invention will now be described with reference to the following drawings, in which:

FIGS. 5a and 5b are schematic representations of operation of the scanning arm assembly of FIGS. 2 to 4 illustrating the production of a scan pattern;

FIGS. 6a-d are schematic representations of operation of the scanning arm assembly of FIGS. 2 to 4 illustrating the production of a further scan pattern;

FIG. 7 is a schematic representation of the operation of the scanning arm assembly of FIGS. 2 to 4, illustrating the production of a raster scan pattern; and FIG. 8 is a schematic representation of a different operation of the scanning arm assembly.

DETAILED DESCRIPTION OF THE PREFERRED EMBODIMENTS

Figure 1:
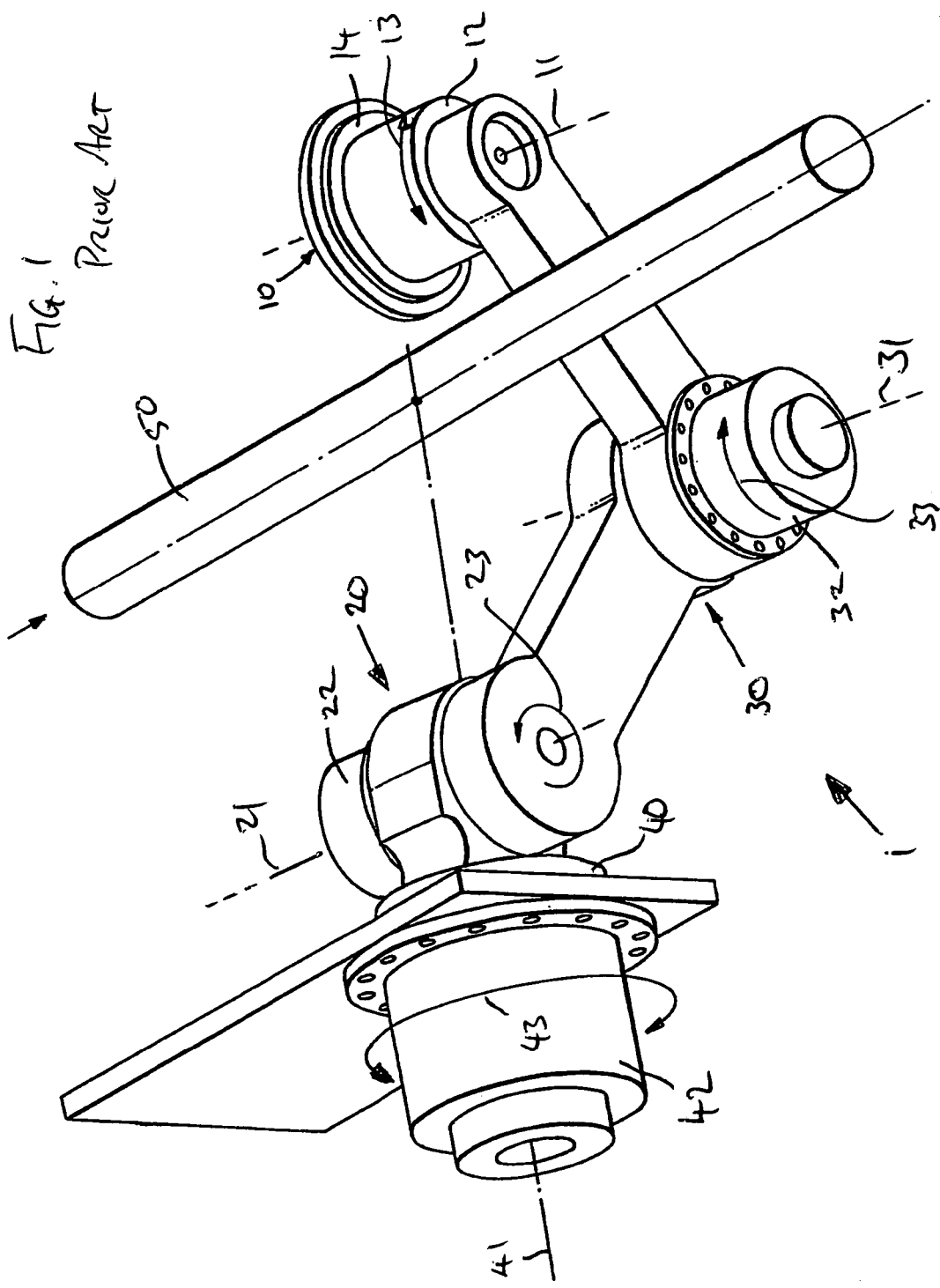
FIG. 1 is a perspective view of a mechanical wafer scanning system according to the prior art.
Figure 2:
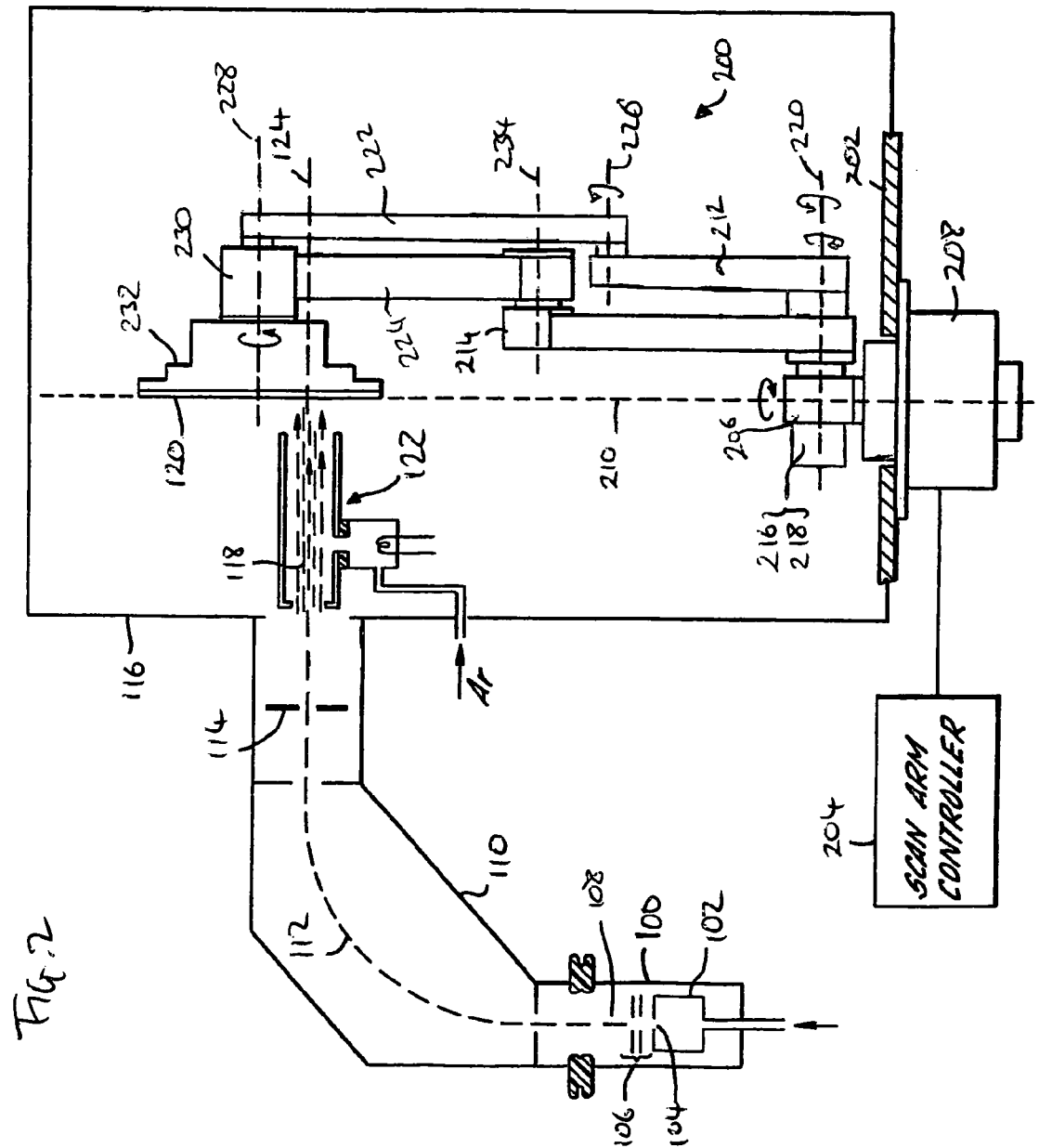
FIG. 2 is a schematic diagram partly in cross-section of an ion implanter incorporating a scanning arm assembly embodying the present invention.

FIG. 2 provides a schematic illustration of an ion implanter. An ion source 100 includes arc chamber 102 in which ions of a species to be implanted are formed. The ions are extracted through a slit 104 in a front face of the arc chamber 100, by means of an electric field controlled by extraction electrodes 106, to form an ion beam 108. The ion beam 108 enters a mass analyser 110 in which a magnetic field directed normal to the plane of the paper of the figure causes the ions to move in a curved path 112, with a radius of curvature dependent on the momentum and charge state of the ions entering the mass analyser 110. Because the ions entering the mass analyser 110 will have the same energy, defined by the potential difference between the arc chamber 102 and the structure of the mass analyser 110, the radius of curvature of the ions in the mass analyser 110 is in practice dependent on the mass-to-charge ratio of the ions.

As a result, the trajectories of ions of different mass-to-charge ratios are dispersed in the plane of the paper of the figure as they leave the mass analyser 110, and a mass resolving slit 114 is arranged to permit only ions of a selected mass-to-charge ratio to pass onwards and enter a process chamber 116 of the ion implanter. The detailed operation and structure of the ion implanter as described so far will be understood by those skilled in this art, and further information may be obtained from U.S. Pat. No. 5,389,793 or U.S. Pat. No. 5,969,366 for example.

In the process chamber 116, an ion beam 118 of ions of selected mass-to-charge ratio (usually singly charged ions of a particular mass) are directed at a semiconductor wafer 120 to implant the ions in the wafer 120 as prescribed by a predetermined semiconductor manufacturing process. In front of the wafer 110, the ion beam 118 passes through an electron flood system 122 of known type (see U.S. Pat. No. 5,399,871) to provide electrons for neutralising any positive charge that may otherwise build-up on the wafer surface during implanting.

The ion beam 118 may have a diameter where it impinges upon the wafer 120 of between 10 and 40 mm, whereas the wafer 120 has a typical diameter of 300 mm (200 mm was previously common, but is less so now). It is very important to ensure that the dose of ions delivered to each unit area of the semiconductor wafer 120 is uniform over the full surface area of the wafer 120 during implants. Accordingly, since in the present embodiment, the ion beam 118 in the process chamber 116 is not scanned, but has a substantially constant beam axis 124, it is important to ensure that the semiconductor wafer 120 is mechanically translated so that the beam 118 describes a predetermined scan pattern on the wafer 120 to ensure uniform distribution of the dose over the wafer surface.

Figure 3:
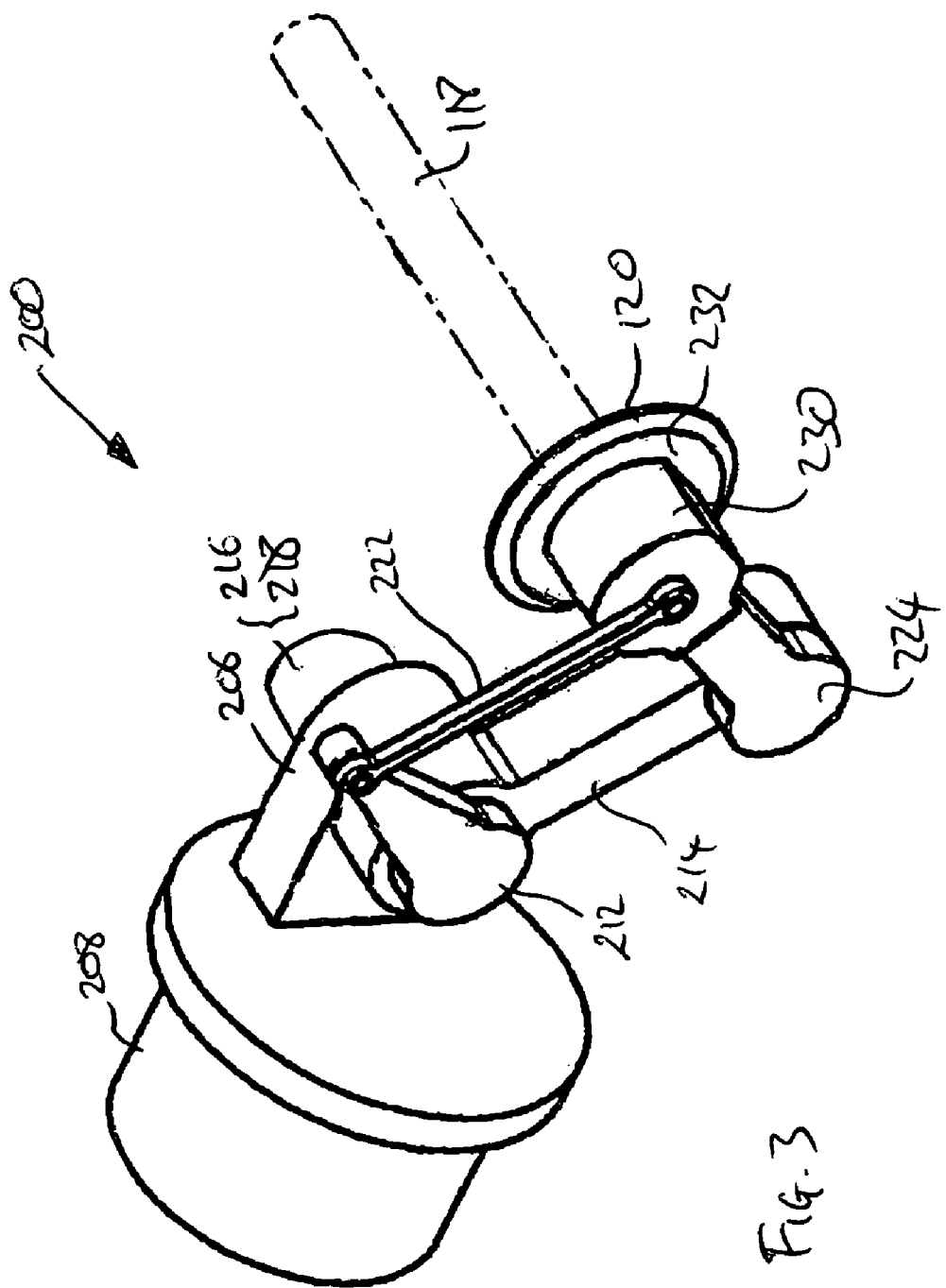
FIG. 3 is a perspective view of the scanning arm assembly of FIG. 2.
Figure 4A:
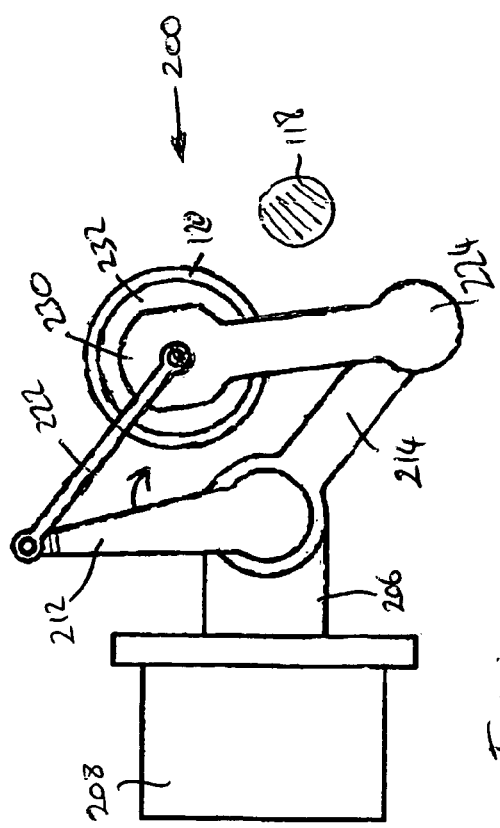
FIGS. 4a and 4b are side views of the scanning arm assembly of FIGS. 2 and 3 showing movement of the assembly to effect a scan line.
Figure 4B:
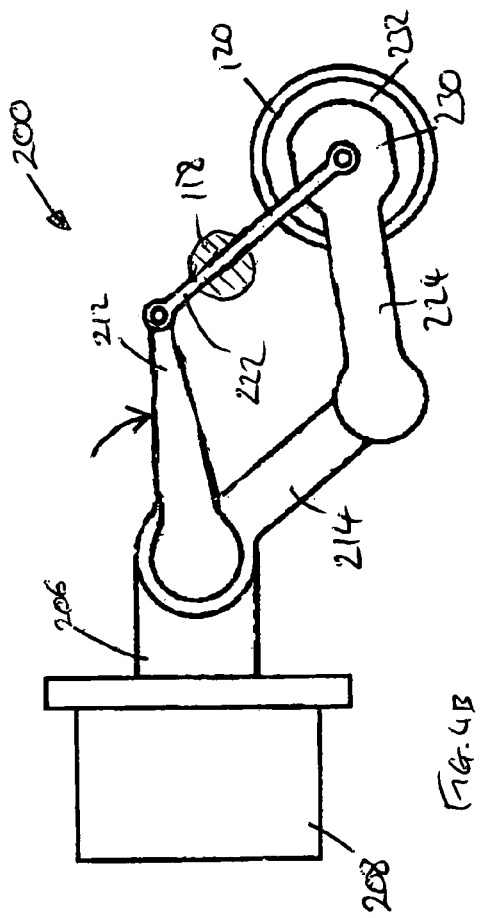

The scanning arm assembly 200 for holding the semiconductor wafer 120 in the process chamber 116 and for scanning the wafer 120 as required across the ion beam 118 will now be described in greater detail. This assembly 200 is illustrated in FIG. 2, and is better illustrated in the perspective view of FIG. 3. FIGS. 4a and 4b also show the assembly 200, as a side view.

The scanning arm assembly 200 mounts to a wall 202 of the process chamber 116 and operates under the direction of a scan arm controller 204. The scan arm controller 204 may be a suitably programmed computer.

The scanning arm assembly comprises a boss 206 that extends inwardly into the process chamber 116. The boss 206 is coupled to a motor 208 that is operable to rotate the boss 206 about an axis 210 that extends along the boss 206 and into the process chamber 116.

A pair of arms corresponding to an upper drive arm 212 and a lower drive arm 214 are attached via rotary joints to the boss 206 so as to extend into the process chamber 116. Associated motors 216, 218 drive the upper 212 and lower 214 drive arms independently about a common axis 220 that extends parallel with the axis 124 of the ion beam 118.

Linkages 222 and 224 are provided at the distal ends of the upper and lower drive arms 212 and 214 on rotary joints such that they may rotate freely. A further rotary joint joins the linkages 222 and 224 at their other ends, thereby forming a quadrilateral. Linkage 222 is a simple tie bar free to rotate about axes 226 and 228 at its ends. Linkage 224 is more substantial and terminates at an enlarged head 230 to which a wafer holder 232 is rotatably attached. The larger size allows services to be run to the wafer holder 232, e.g. electrical supplies where the wafer holder 232 is an e-chuck that holds wafers 120 in place electrostatically. The linkage 224 is free to rotate about axes 228 and 234 at its ends.

The enlarged head 230 provided at the distal end of linkage 224 houses a small motor that is used to drive the wafer holder 232 about its centre, i.e. about axis 228. This of course effects rotation of the wafer 120 when held by the wafer holder 232.

Scan arm controller 204 uses motors 216 and 218 to rotate drive arms 212 and 214, thereby actuating linkages 222 and 224 that in turn drive wafer 120 through the ion beam 118. An example of a driving motion is shown in FIGS. 4a and 4b where motor 216 is used to rotate drive arm 212 in a clockwise direction. Motor 218 remains inactive such that drive arm 214 maintains its position. Rotation of drive arm 212 drives linkages 222 and 224 to move such that the wafer 120 moves to the right and down. The resulting path that the wafer 120 follows passes through ion beam 118.

As will be readily understood, rotating the other drive arm 214, while keeping drive arm 212 still, causes a different motion of the wafer 120. Both drive arms 212 and 214 may be driven simultaneously and varying their relative speeds of rotation allows many different paths to be created, and hence many different scan patterns to be implemented. FIGS. 5 to 8 provide some examples of possible scan patterns 300.

FIGS. 5a and 5b show a scan pattern 300 that can be achieved by driving the drive arms 212 and 214 in turn. An initial position of the scanning arm assembly 200, including wafer 120, is shown in solid lines in these Figures, whereas the broken lines indicates a final position of the scanning arm assembly 200.

The scanning pattern 300 approximates to a raster pattern and comprises a series of arcuate scan lines 302 separated by arcuate steps 304 where the wafer 120 is moved to the next scan line 302 start position.

FIG. 5a shows the movement effected to complete the first scan line 302. During the movement, motor 216 is not used so that drive arm 212 remains static. Motor 218 is used to rotate drive arm 214 clockwise as indicated by the arrows at 306, causing the linkages 222 and 224 to scan the wafer 120 down along scan line 302. For the next scan line, motor 218 rotates drive arm 214 counter-clockwise, as indicated by the arrows at 306, to drive the wafer 120 up the next scan line 302. This alternative clockwise/counter-clockwise rotation of drive arm 214 continues such that the wafer 120 moves up and down successive scan lines 302 to complete the scan pattern 300.

FIG. 5b illustrates the movement performed by the scanning arm assembly to move the wafer along steps 304 between scan lines 302. During these steps 304, motor 218 is inactive such that drive arm 214 does not move. Motor 216 rotates drive arm 212 clockwise in small movements as indicted by the arrows at 308. Each movement sees the wafer 120 move between successive scan lines 302. FIG. 5b shows the movement required to move between the first and last scan lines 302 in the scan pattern 300.

Thus the scan pattern 300 shown in FIGS. 5a and 5b may be effected by first rotating drive arm 214 clockwise, then incrementing drive arm 212 clockwise, then rotating drive arm 214 counter-clockwise, then incrementing drive arm 212 clockwise, and so on. This scheme is particularly easy to implement as only one of the drive arms 212 and 214 are operated at any one time. In practice, it may be advantageous to operate drive arm 212 to move between scan lines 302 as drive arm 214 is decelerated and then accelerated from rest. This operation should be performed using scan lines 302 that see the wafer 102 moved clear of the ion beam 118 such that each turnaround is performed with the ion beam 118 off the wafer 120.

As a result, a scan pattern may be created using simple movements of the drive arms 212 and 214, allowing rapid scanning.

FIGS. 6a-d show a scan pattern 300 that can be achieved by driving the drive arms 212 and 214 synchronously. In each of FIGS. 6a-d, the initial position of the scanning arm assembly 200, including wafer 120, is shown in broken, whereas the solid lines indicate a final position of the scanning arm assembly 200.

FIG. 6a shows the movement made to trace the first scan line 302. From a starting position with the wafer 120 to the lower left, both drive arms 212 and 214 are driven anticlockwise with equal speed. The direction of motion is indicated by arrows 306. This ensures the radius from the common axis 220 to the centre of the wafer 120 remains constant for the whole scan line 302. Thus scan line 302 defines an arc centred on the common axis 220.

FIG. 6b shows how the drive arms 212 and 214 are driven in opposite senses, drive arm 212 clockwise and drive arm 214 anticlockwise, such that the radius between the common axis 220 and centre of the wafer 120 increases. This movement results in the arcuate step 304 being traced.

FIG. 6c shows how the second scan line 302 is traced. Both drive arms 212 and 214 are driven clockwise with equal speed such that scan line 302 comprises a further arc centred on the common axis 220, this time having a larger radius.

FIG. 6d show the next step 304 being formed. Drive arms 212 and 214 are driven in opposite senses, again increasing the radius from the common axis 220 to the centre of the wafer 120. Thus the wafer 120 is moved into position for the third scan line 302 to be traced. As the third scan line 302 corresponds to the first scan line 302, the above procedures can be repeated to form the scan pattern 300 indicated in FIG. 6d. As can be seen and as will be appreciated from the above description, each scan line 302 corresponds to an arc of a circle with ever-increasing radius, centred on the common axis 220. Advantageously, this means that the scan lines 302 are separated by a uniform distance along their lengths. Should the separation vary, the speed of rotation of the drive arms 212 and 214 would have to be varied along each scan line 302, i.e. to speed up where separation decreases in order to achieve a uniform implant dose. It is also advisable to increment the radius uniformly, as this provides a uniform separation between each scan line 302 and so allows the same scan speed to be used for each scan line 302.

A further scan pattern 300 is shown in FIG. 7 that corresponds to a linear raster scan. To achieve this pattern, the scan arm controller 204 must operate drive arms 212 and 214 must be operated simultaneously and in coordinated fashion. Conveniently, the drive arms 212 and 214 are the same length such that they may be driven at the same speed but in opposite senses.

Motors 216 and 218 are controlled by drive voltages provided by scan arm controller 46 (FIG. 2). The scan arm controller 204 coordinates the speed of rotation of motors 216 and 218, in accordance with a predetermined control algorithm, so that the wafer 120 is moved in accordance with the scan pattern 300 across the ion beam 120. A simultaneous anticlockwise motion of drive arm 214 and clockwise motion of drive arm 212 produces the linear scan motion of the wafer 120 to the right along scan lines 302, illustrated in FIG. 7. Rotating the scan arms 212 and 214 in the opposite senses causes the wafer 120 to follow scan lines 302 from right to left. Hence, alternate scan lines 302 can be performed in opposite directions. Appropriate rotation of the scan arms 212 and 214 causes the wafer 120 to move vertically, either up or down steps 304 as desired. The scan arm controller 204 controls the speed of the motors 216 and 218 in accordance with the predetermined algorithm to provide a constant scan speed of the wafer 120 along the scan lines 302.

The wafer holder 232 is further rotatably mounted to the enlarged head 230 of linkage 224 so as to be rotatable about an axis of rotation 228. The scan arm controller 46 causes the wafer holder 232 to rotate as the wafer 120 is translated along scan line 302 so as to maintain the orientation of the wafer 120 constant about the axis 228. The scan arm controller 204 produces corresponding rotation during steps 304 of the scan pattern 300 so that the wafer orientation is maintained constant throughout.

In the arrangement shown in FIG. 5, axes 220, 226, 228 and 234 of the scan arm assembly 200 are normal to the plane of the paper, so that the two-dimensional scan pattern 300 produced is in a scan plane parallel to the plane of the paper.

As described above, scan arm assembly 200 is mounted to the wall 202 of the process chamber 110 by a further rotary joint 40 having an axis of rotation 41 that is parallel to the scan plane defined by the articulation of the scan arm assembly 200. The entire scan arm assembly 200 can be rotated about axis 41 by means of the motor 42 to cause a corresponding rotation of the scan plane relative to the ion beam axis 124. In this way, the scan plane can be angled to enable a desired angle of implantation into a wafer 120 on the wafer holder 232. The wafer 120 may be rotated about axis of rotation 228 to ensure features on the wafer 120 are presented to the ion beam 118 correctly, e.g. trenches are presented with the correct tilt and orientation to allow doping of their side walls.

In the embodiments described herein, the axis 41 of rotation of the scan arm assembly 200 lies in the plane occupied by a wafer 120 and also intercepts the beam axis 124, as best shown in FIG. 2. This geometry ensures that the implant angle of the wafer 20 can be adjusted by rotation of the scan arm assembly 200 about the axis 41, without producing any movement of the centre of the scan pattern 300 along the beam axis 124, and has been referred to as isocentric implant angle adjustment.

The scan arm controller 208 controls the scan arm assembly 200 in accordance with a predetermined algorithm stored in memory within the scan arm controller 204. Devising an appropriate algorithm to effect any of the scan patterns described herein would not present a problem to a skilled person. For example the relationships between the rotary positions of the various motors and desired positions of the wafer 210 are defined by trigonometric equations which can easily be deduced by the skilled person. As described above, the arrangement of the two drive arms 218 and 214 to be rotated about a common axis simplifies the mathematical consideration of movement of the wafer 120. In particular, the problem of WO 2004/001789 where one drive arm is mounted to the end of the other drive arm, and so its axis of rotation moves, is avoided.

The raster scan pattern 300 illustrated in FIGS. 5 and 6 provides relatively long reciprocating linear motions interconnected by short transverse motions, to produce a series of parallel scan lines 302, either linear or arcuate. Further alternative scan orientations and patterns can be achieved. For example in FIG. 8, the linear scan pattern 300 of FIG. 7 has been rotated by approximately 45° relative to the axis 210. An appropriate algorithm can readily be devised and stored in the scan arm controller 204 to perform this scan pattern 300. An advantage of this scan pattern 300 is that the long reciprocating movements of the wafer 210 represented by the parallel scan lines 302, is accommodated by a relatively larger rotational movement of the drive arm 212, and a relatively smaller angular movement of the drive arm 214. This may provide a reduced loading on the motors 216 and 218 during performance of the scan pattern 300. It will be appreciated that the scanning should be performed at relatively high speed in order to achieve appropriate dose uniformity, or a required low overall dose from a relatively high beam current, and in any case to maximise productivity.

Although the scan pattern 300 of FIG. 8 is illustrated with the scan lines 302 extending diagonally between top left and bottom right in the figure, it should be appreciated that the scan arm assembly 200 may be mounted in the process chamber 116 so that gravity acts on the scan arm assembly 200 substantially perpendicularly to the scan line 302 in the direction of the arrow 310. Then the main reciprocating motion of the wafer 210 along the scan lines 302 can be horizontal, again minimising loading on the drive motors 316 and 318.

The skilled person will appreciate that changes may be made to the above-described embodiment without departing from the scope of the present invention.

Specific details of the scanning arms 212 and 214 and the linkages 222 and 224, such as their size and shape may be varied. As will be apparent, changes to their size and shape may be tailored to produce a desired path for the wafer holder 232. As noted above, the linkages may use rotation or translation, or a mixture of the two, to transmit movement of the drive arms 212 and 214 to the wafer holder 22. Sliding arrangements may be used to join the linkages to the drive arms 212, 214 and to each other.

Not all the modes of movement described above need be implemented. If only normal implants were required, one could dispense with the facility to perform tilt implants by omitting motor 208 and making the boss 206 fixed in position. If orientation of the wafer 120 is not critical, the wafer holder 232 may be fixed, i.e. one could dispense with the motor provided in the enlarged head 230 of linkage 224.

A vast number of scan patterns may be created using a scanning arm assembly 200 according to the present invention. Where a ribbon beam is used, the scanning arm assembly 200 may be used to effect a single sweep of the wafer 120 across the ribbon beam. Where a spot ion beam is employed, raster patterns are more usual. The raster pattern may be effected to comprise linear scan lines or arcuate scan lines. The wafer 120 may be moved through the ion beam 118 in a common direction for each scan line, or the wafer 120 may be moved in alternate directions for each successive scan line. Other well-known schemes are straightforward to implement, such as interlaced scans where only every other scan line (or every third, fourth, etc. scan line) is implanted in one pass, then another set of missed scan lines are implanted on the next pass, and so on. The wafer 120 may be rotated between passes.

The present invention has been described in the above embodiments in the context of scanning wafers 120 during implants. However, it will be appreciated that the scanning arm assembly 200 may also be used to co-operate with a wafer transfer robot during loading and unloading of wafers 120. For example, the scanning arm assembly 200 may be rotated about axis 210 such that the wafer 120 is held flat on top of the wafer holder 232. The scanning arms 212 and 214 may also be used to position the wafer 120 conveniently for co-operation with the robot.

The invention claimed is:

1. A substrate scanner for scanning a substrate through an ion beam in an ion implanter, the substrate holder comprising:
    a first drive arm provided on a rotary joint;
    a second drive arm provided on a rotary joint;
    drive means operable to rotate the first drive arm about a fixed first axis of rotation and to independently rotate the second drive arm about a fixed second axis of rotation;
    a linkage; and
    a substrate holder coupled to the linkage;
    wherein the linkage is coupled to the first drive arm at a location removed from the first axis and coupled to the second drive arm at a location removed from the second axis such that the substrate holder moves as the first and/or second drive arm is rotated, the independent rotation of the first and second drive arms providing varied two-dimensional scan patterns.

2. The substrate scanner of claim 1, wherein the first and second axes are parallel.

3. The substrate scanner of claim 2, wherein the first and second drive arms are coupled to a support such that the first and second axes are coaxial.

4. The substrate scanner of claim 3, wherein the support is adapted to be mounted to a chamber wall of the ion implanter.

5. The substrate scanner of claim 4, wherein the first and second drive arms are coupled to the support adjacent the chamber wall.

6. The substrate scanner of claim 1, wherein the first and second drive arms are coupled to the support at respective proximal ends.

7. The substrate scanner of claim 6, wherein the first and second drive arms are coupled to the linkage at respective distal ends.

8. The substrate scanner of claim 1, wherein the linkage comprises first and second members rotatably coupled together to rotate about a third axis, the first member also being rotatably coupled to the first drive arm to rotate about a fourth axis and the second member also being rotatably coupled to the second drive arm to rotate about a fifth axis.

9. The substrate scanner of claim 8, wherein the first axis, second axis, third axis, fourth axis and fifth axis are parallel.

10. The substrate scanner of claim 9, wherein ends of the first and second members are coupled to the first and second drive arms respectively.

11. The substrate scanner of claim 10, wherein further ends of the first and second members are coupled to each other.

12. The substrate scanner of claim 11, wherein the first member is provided with the substrate holder.

13. The substrate scanner of claim 12, wherein the substrate holder is provided at the end of the first member that is coupled to the second member.

14. The substrate scanner of claim 8, wherein the substrate holder is rotatably coupled to the linkage to allow rotation about a sixth axis that extends parallel to the first, second, third, fourth and fifth axes, and the substrate holder comprises substrate holder drive means operable to rotate the substrate holder about the sixth axis.

15. The substrate scanner of claim 14, wherein the sixth axis extends substantially through the centre of the substrate holder.

16. The substrate scanner of claim 15, wherein the substrate holder drive means comprises a motor operable to rotate the substrate holder about the sixth axis.

17. The substrate scanner of claim 1, wherein the first drive means comprises a first motor operable to rotate the first drive arm about the first axis and the second drive means comprises a second motor operable to rotate the second motor about the second axis.

18. The substrate scanner of claim 3, wherein the support is rotatably mounted so as to be rotatable about a seventh axis.

19. The substrate scanner of claim 18, wherein the seventh axis is substantially normal to the first axis so as to extend in the general direction of the substrate holder.

20. The substrate scanner of claim 19, wherein the seventh axis extends so as to pass directly in front of the substrate holder.

21. An ion implanter comprising an ion source operable to generate an ion beam, optics operable to guide the ion beam along an ion beam path, and the substrate scanner of claim 1 operable to scan the substrate through the ion beam, wherein the first axis is parallel to the direction of the ion beam path at the substrate scanner.

22. A method of implanting a substrate using the ion implanter of claim 21, wherein the substrate holder is holding a substrate to be implanted, the method comprising:
positioning the substrate adjacent the ion beam; and
using the drive means to rotate the first drive arm thereby causing the substrate to travel through the ion beam, such that the ion beam traces a scan line across the substrate.

23. The method of claim 22, wherein the first and second axes are parallel, comprising using the drive means to rotate the first and second drive arms in the same sense and at the same speed such that the ion beam traces a scan line across the substrate corresponding to an arc of a circle.

24. The method of claim 23 comprising, after tracing the arcuate scan line, using the drive arms to rotate the first and second drive arms to change the distance between the parallel first and second axes and the substrate holder.

25. The method of claim 24, comprising using the drive means to rotate the first and second drive arms in opposite senses.

26. The method of claim 25, comprising using the drive means to rotate the first and second drive arms at the same speed.

27. The method of claim 24, further comprising using the using the drive means to rotate the first and second drive arms in the same sense and at the same speed such that the ion beam traces a further scan line across the substrate corresponding to an arc of a circle of different radius.

28. The method of claim 27, comprising repeating the steps of using the drive means to rotate the first and second drive arms to trace arcuate scan lines and to change the distance between the parallel first and second axes and the substrate holder, such that series of scan lines are traced across the substrate corresponding to a series of arcs of concentric circles of differing radius.

29. The method of claim 28, comprising using the drive means to rotate the first and second drive arms repeatedly such that the distance between the parallel first and second axes and the substrate holder is changed uniformly such that the arcuate scan lines are evenly separated.

30. The method of claim 27, comprising using the drive means to rotate the first and second drive arms in the same sense repeatedly at a common same speed, thereby providing uniform dosing of the substrate.

31. The method of claim 22, comprising using the drive means to rotate the first and second drive arms simultaneously such that the ion beam traces a straight scan line across the substrate.

32. The method of claim 31, comprising using the drive means to rotate the first and second drive arms simultaneously in opposite senses while the ion beam traces a straight scan line across the substrate.

33. The method of claim 31, further comprising using the drive means to rotate the second drive arm thereby to move the substrate to be ready for the implantation along the next scan line.

34. The method of claim 31, comprising using the drive means repetitively to rotate the first and second drive arms such that the ion beam traces a series of scan lines across the substrate.

35. The method of claim 34, wherein the series of scan lines forms a raster pattern.

36. The method of claim 31, further comprising rotating the substrate while using the drive means to move the substrate through the ion beam so as to maintain the orientation of the substrate relative to the ion beam.

37. A method of scanning a substrate through an ion beam in ion implanter using a scanning arm, the method comprising: rotating a first part of the scanning arm about a fixed first axis of rotation; and independently rotating a second part of the scanning arm about a fixed second axis of rotation, wherein the scanning arm comprises a third part linking the first and second parts, the third part having a substrate holder coupled thereto; wherein the third part is coupled to a first part at a location removed from the first axis and coupled to the second part at a location removed from the second axis such that the substrate holder moves as the first and/or second part are rotated, the independent rotation of the first and second drive parts providing varied two-dimensional scan patterns.

38. The method of claim 37, wherein the first and second axes are parallel.

39. The method of claim 38, wherein the first and second axes are coaxial.

40. A computer programmed and arranged to effect the method of claim 22.

41. An ion implanter comprising the computer of claim 40.

42. A computer program comprising computer program instructions that, when executed on a computer arranged to control the operation of an ion implanter, cause the ion implanter to operate in accordance with the method of claim 22.

43. A computer readable medium having recorded thereon the computer program of claim 42.

* * * * *